(12) United States Patent
Japp et al.

(10) Patent No.: US 6,355,364 B1
(45) Date of Patent: Mar. 12, 2002

(54) PROCESS OF HEAT TREATING AND ANNEALING CIC AND CIC CREATED THEREBY

(75) Inventors: Robert M. Japp, Vestal; Lisa J. Jimarez, Newark Valley; Bonnie S. McClure, Endwell, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/343,078

(22) Filed: Jun. 29, 1999

(51) Int. Cl.$^7$ .............................. B23B 15/20; C21D 9/46
(52) U.S. Cl. ...................... 428/676; 148/516; 148/527; 148/532; 148/559; 148/621; 148/648; 148/650; 148/651; 148/653; 148/684; 428/675; 428/926; 428/925; 428/610
(58) Field of Search ................................. 428/676, 675, 428/926, 925, 610; 148/516, 527, 532, 559, 621, 648, 650, 651, 653, 684; 420/94, 591

(56) References Cited

U.S. PATENT DOCUMENTS

| | | | | |
|---|---|---|---|---|
| 4,996,115 A | * | 2/1991 | Eerkes et al. ................ | 428/676 |
| 5,064,173 A | | 11/1991 | Ecalle et al. ................... | 266/80 |
| 5,089,059 A | | 2/1992 | Reiniche et al. ............ | 148/500 |
| 5,128,008 A | * | 7/1992 | Chen et al. ............ | 204/192.15 |
| 5,613,185 A | | 3/1997 | Marsden et al. .............. | 419/58 |
| 6,179,990 B1 | * | 1/2001 | Galasco et al. ............. | 205/735 |

FOREIGN PATENT DOCUMENTS

JP 85028886 B 7/1985

OTHER PUBLICATIONS

"Process Considerations in the Fabrication of Teflon Printed Circuits Boards", by Light et al, 1994 Proceedings, 44 Electronic Components & Technology Conference, May 1994, pp. 542–549.

"High Performance Carrier Technology: Materials and Fabrication", by Light et al, 1993 International Electronics Packaging Conference, San Diego, California, vol. 1, pp. 440–456; Sep. 12–15, 1993.

"High Performance Carrier Technology", by Heck et al, 1993 International Electronics Packaging Conference, San Diego, California, vol. 1, pp. 771–779; Sep. 12–15, 1993.

Harvey et al., "Separator Sheets Used To Prevent Interdiffusion of Copper," IBM Technical Disclosure Bulletin, vol. 35, No. 2, pp.319–320, Jul. 1992.

Grebe et al., Fabrication of High Quality Defect–Free Metal Carriers, IBM Technical Disclosure Bulletin, vol. 36, No. 1, pp. 5–6, Jan. 1993.

* cited by examiner

*Primary Examiner*—Robert R. Koehler
(74) *Attorney, Agent, or Firm*—Schmeiser, Olsen & Watts; Lawrence R. Fraley

(57) ABSTRACT

Processes for preparing copper-INVAR-copper (CIC) for use in making chip packaging and the CIC created. One process comprises annealing a CIC section at a temperature in a range of 1475° F. to 1625° F. for a time in a range of 40 to 120 seconds. Another process includes heat treating a CIC section at a temperature in a range of 1275° F. to 1425° F. for a time in a range of 40 to 120 seconds. The above processes can be combined. The CIC section created exhibits unique electrical, physical, and mechanical properties.

37 Claims, 2 Drawing Sheets

PROCESS OF HEAT TREATING AND ANNEALING CIC AND CIC CREATED THEREBY

BACKGROUND OF THE INVENTION

1. Technical Field

The present invention relates generally to processes for preparing copper-Invar-copper (CIC) for use in making chip packaging. More particularly, the invention relates to processes of preparing CIC with heat treating and annealing and the CIC cut created thereby.

2. Related Art

Copper-INVAR-copper (CIC) is a useful material for high performance circuit packaging and chip carrier applications due to its excellent thermal, mechanical and electrical properties. The properties of the CIC determine the end performance of the package. In particular, to perform properly, a high performance chip carrier (HPCC), for example, must exhibit a coefficient of thermal expansion (CTE) approximately midway between silicon (approx. 3.4 PPM/° C.) and conventional epoxy/glass boards (approx. 17–20 PPM/° C). Additionally, the electrical design requires very tight control of electrical resistance. While the properties of the CIC are affected by the original CIC inlay ratio (copper to INVAR ratio), they are also greatly affected by fabrication processes, e.g., rolling to decrease the thickness of the CIC, annealing and heat treating. Unfortunately, prior to the present invention, CIC preparation processes have been unable to concurrently obtain optimum CTE, mechanical and electrical properties.

Fluoropolymer dielectrics (e.g., Rogers 2800® manufactured by Rogers, Inc. of Rogers, Conn.) and CIC have been used together for conventional printed circuit packaging applications. The use of a fluoropolymer dielectric layer requires the laminate to be exposed to extremely high lamination pressure. However, when CIC and fluoropolymer are used together to make HPCCs with very tight registration requirements due to their grid and feature size, high lamination pressure can have a severe negative effect. Since CIC has a much higher tensile modulus than fluoropolymer, the CIC controls the dimensional behavior of the package. Therefore, the CIC must possess the right mechanical strength and stiffness which are largely determined by mechanical and thermal processing history.

In view of the foregoing, there has been a need in the art for CIC processes to control the thermal, electrical and mechanical properties as well as the dimensional stability performance of CIC. Further, there is a need for processes that allow combining of CIC and fluoropolymer dielectric.

SUMMARY OF THE INVENTION

Whenever CIC is heated to high temperatures, a diffusion layer is formed. In accordance with the invention, it has been discovered that the CIC preparation for package manufacturing must be sufficient to fully anneal both the copper and the INVAR while minimizing the interdiffusion of the two metals. Interdiffusion results in an intermetallic layer between each copper layer and the INVAR which can drastically increase the mass resistivity of the CIC and hinder further processing. It has also been discovered that formation of this layer is dependent on both the time and temperature at which the layer is heated.

In a first general aspect in accordance with the present invention is provided a process of preparing a copper-INVAR-copper clad sheet comprising the steps of: providing a section of copper-INVAR-copper clad sheet; and annealing the section at a temperature in a range of 1475° F. to 1625° F. for a time in a range of 40 to 120 seconds.

In a second general aspect in accordance with the invention is provided a process of preparing a copper-INVAR-copper clad sheet comprising the steps of: providing a section of copper-INVAR-copper clad sheet; and heat treating the section at a temperature in a range of 1275° F. to 1425° F. for a time in a range of 40 to 120 seconds.

The annealing and heat treating processes for CIC of the claimed invention enhance the manufacturing yield and end performance of chip packages and provide a CIC clad sheet, possibly with a fluoropolymer dielectric layer, exhibiting optimum properties. In particular, the annealing process allows for fully annealing the copper and the INVAR while minimizing the intermetallic layer. Hence, it provides optimum recrystallization of the INVAR grain structure. It also results in softer INVAR which allows the additional rolling steps necessary for further thickness reductions.

The heat treating process provides for fully annealing the copper and partially annealing and stress relieving the INVAR. The heat treating process produces the best mechanical properties by: reducing the anisotropic structure of the CIC sheet created by rolling resulting in more uniform residual stresses, improving etchability of the CIC section and creating stress uniformity in the finished packages.

Both processes provide the benefit of minimizing the intermetallic layer in the CIC, which aids in prevention of etchback during electrochemical polishing (ECP) and improved resistivity.

In a third general aspect of the invention is provided a larninate comprising a clad copper-INVAR-copper structure and having a mass resistivity in a range of 0.75 to 1.0 ohm.gram/m².

In a fourth general aspect of the invention is provided a clad sheet comprising a layer of INVAR between two layers of copper and having a mass resistivity in a range of 0.55 to 0.85 ohm.gram/m².

The third and fourth aspects provide CIC clad sheets having the tensile and yield strength to resist the physical forces present during the lamination cycle, the proper modulus and CTE to achieve the right composite CTE for the packaging application and low enough resistivity to handle the current distribution power required by the electrical design.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment.

Figure 1:
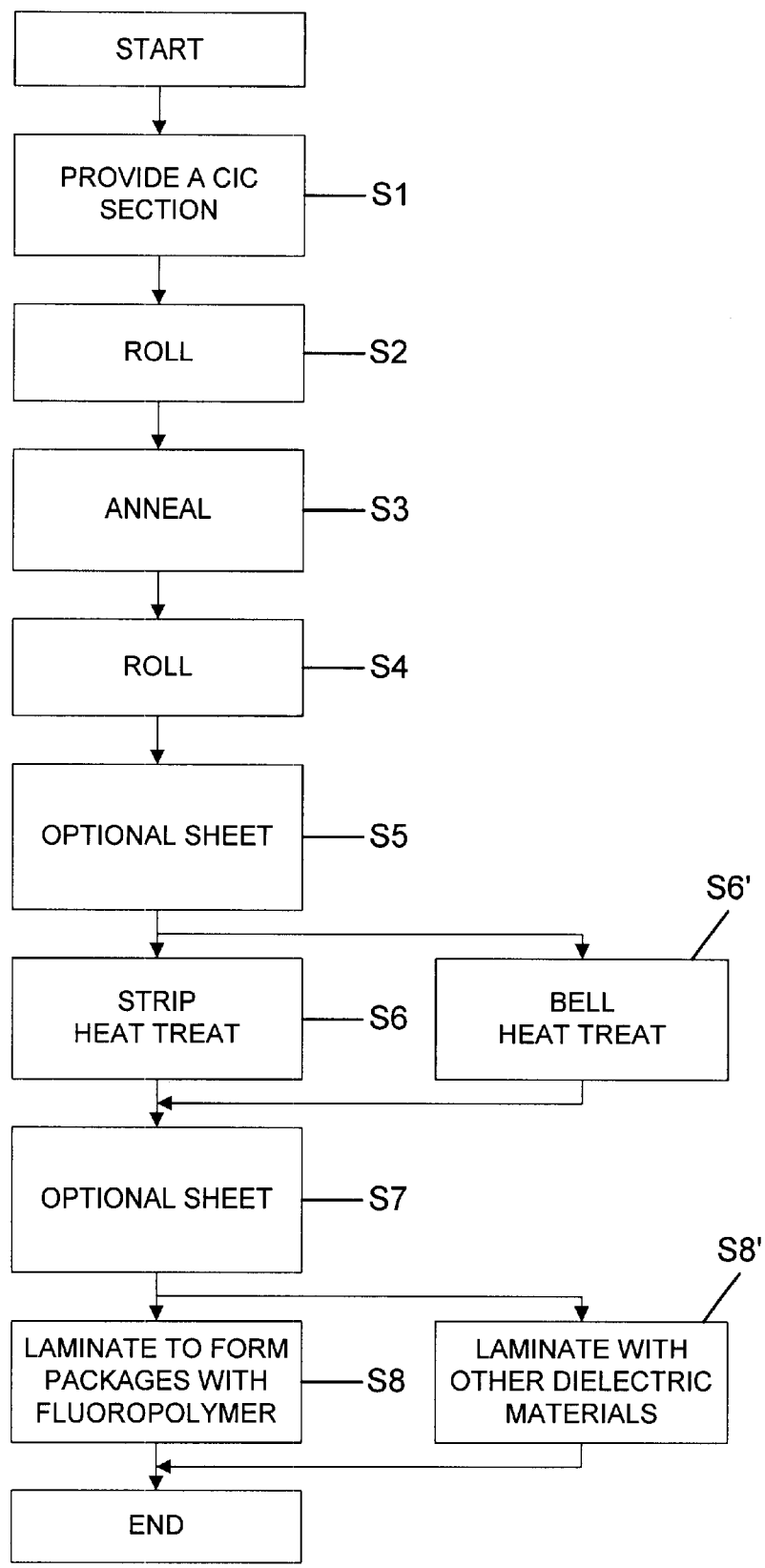
FIG. 1 shows a flow diagram including the processes in accordance with the present invention.

Referring to FIG. 1, the overall processes for preparing copper-INVAR-copper (CIC) is shown. In step S1, a section of CIC is provided. CIC is supplied as a clad starting material in various inlay ratios by, for example, Texas Instruments. The inlay ratios for the CIC range from 12.5%/75%/12.5% to 30%/40%/30%. Preferably, the CIC is provided as 12.5%/75%/12.5% because it has a CTE of approximately 2.5 PPM/° C. which, later, when combined with the higher CTE of filled fluoropolymer, (25 PPM/° C.), will give the desired CTE of 8–12 PPM/° C., approximately midway between silicon (approx. 3.4 PPM/° C.) and conventional epoxy/glass boards (approx. 17–20 PPM/° C.). This CTE allows for creation of HPCCs having CTE of 8–12 PPM/° C. Furthermore, 12.5%/75%/12.5% CIC has a high tensile modulus and good electrical conductivity. The CIC is preferably provided in a roll form.

The CIC provided in step S1 normally has a thickness of approximately 6 mil, which is too thick for formation into chip packages. Accordingly, in step S2, the CIC is rolled to approximately 4 mils.

Next in step S3, in accordance with one aspect of the present invention, the CIC section is annealed at a temperature in a range of 1475° F. to 1625° F. for a time in a range of 40 to 120 seconds. Most preferably, the temperature is approximately 1550° F. and the time duration is approximately 60 seconds. The anneal can take place in, for example, a strip anneal furnace in either a reducing hydrogen atmosphere or an inert atmosphere, e.g., argon, helium, etc.

The annealing process allows for fully annealing the copper and the INVAR while minimizing the intermetallic layer. Surprisingly, this annealing process improves electrical resistivity of the CIC section and provides optimum recrystallization of the INVAR grain structure. It also substantially softens the INVAR which allows the additional rolling steps necessary for further thickness reductions. Another benefit of minimizing the intermetallic layers in the CIC is the prevention of etchback that occurs during ECP. ECP is provided to remove excess material after laser through hole formation used during the process of fabricating a laminate chip carrier (LCC).

Post-anneal CIC has properties as follows: tensile strength ranging from 55–75 kpsi, and, preferably approximately 65 kpsi; elongation ranging from 12–14%; a mass resistivity 0.55 to 0.85 ohm.gram/m$^2$, and preferably approximately 0.70 ohm.gram/m$^2$; a hardness in the range of 170–230 Knoop, and preferably approximately 200 Knoop; and an intermetallic layer of 0.1 to 3 microns, and preferably approximately 1.5 micron.

In step S4, the CIC section is rolled again to decrease the thickness to approximately 2 mils.

At this point, in step S5, the CIC section may be sheeted, i.e., cut into smaller sections, if desired.

In step S6, in accordance with a second aspect of the invention, the CIC section is heat treated in a strip anneal furnace at a temperature in a range of 1275° F. to 1425° F. for a time in a range of 40 to 120 seconds. Most preferably, the CIC section is heat treated at approximately 1350° F. for approximately 60 seconds. If the CIC is sheeted in step S5, heat treating is preferably optionally performed in a bell anneal furnace as indicated in step S6'. Heat treating in a bell anneal furnace can be performed at a temperature in the range of 1000° F. to 1200° F. for a time in the range of 7 to 9 minutes. Most preferably, the CIC is heat treated at 1100° F. for 8 minutes. Bell anneal is performed in an inert atmosphere such as argon or helium. If the CIC section is not sheeted until after heat treating, i.e., step S7, heat treating is preferably performed in a strip anneal furnace in either a reducing hydrogen atmosphere or an inert atmosphere, e.g., argon, helium, etc.

The heat treating process provides for fully annealing the copper and partially annealing and stress relieving the INVAR while minimizing the intermetallic layers. The heat treating process produces the best mechanical properties by: reducing anisotropic grain structure of the CIC section resulting in uniform stress, improving etchability of the CIC section and creating stress uniformity in the finished packages. It also provides optimal electrical resistivity by minimizing the formation of intermetallic layers.

If the CIC is not sheeted, i.e., cut into sections in step S5, it can be provided post-heat treating in step S7.

Last, in steps S8 or S8', the CIC enters the first step of an LCC fabrication process, which includes the layering of CIC sections and various dielectric materials. In particular, in step S8, a layer of fluoropolymer dielectric such as Rogers 2800®, manufactured by Rogers, Inc. of Rogers, Conn., may be laminated onto the on the CIC section. Alternately, in step S8', other suitable non-fluoropolymer dielectric materials may also be used.

It should be recognized that the invention relates not only to the anneal and heat treating processes individually, but to the combination of the processes which result in a CIC clad sheet having optimum properties.

With further regard to the optional lamination of Rogers 2800® fluoropolymer dielectric, this step requires extreme temperatures and pressures. The temperature, pressure and time currently used are approximately 716° F. and 1700 psi for up to 6 hours. These conditions create large forces which act to change the physical dimensions of the product. The processes described above, however, allow packages to be fabricated with maximum yield by insuring that the CIC has the optimum combination of physical properties such as strength, CTE and isotropy.

Figure 2:
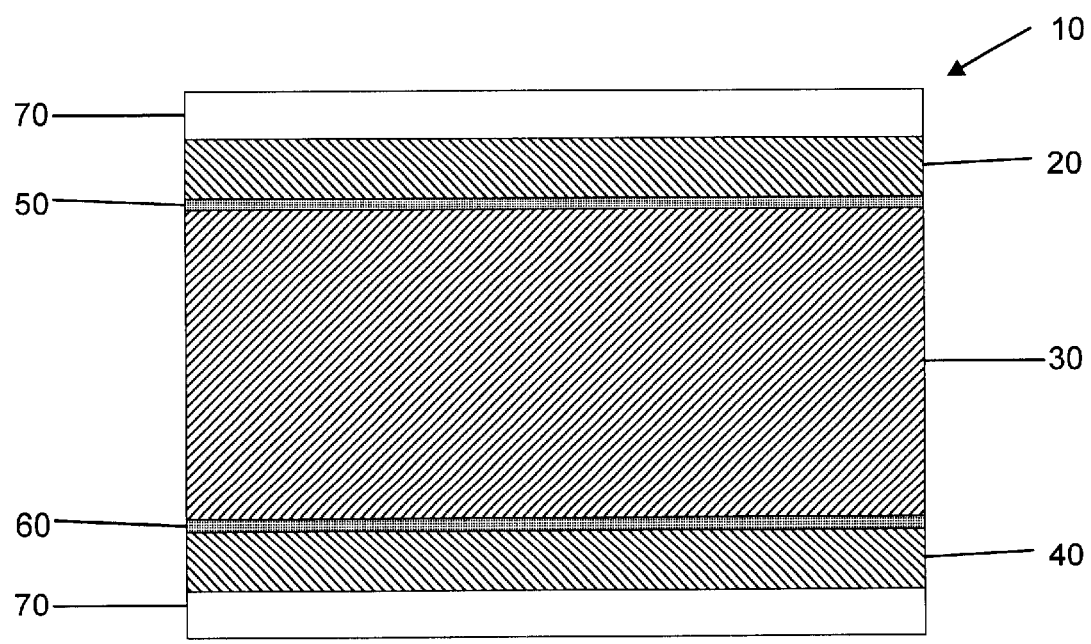
FIG. 2 shows a laminate in accordance with the present invention.

Referring to FIG. 2, a laminate 10 prepared by the process of FIG. 1 is shown. Laminate 10 includes an INVAR layer 30 between two layers of copper 20, 40 and at least one diffusion layer 50, 60 between INVAR layer 30 and a layer of copper 20, 40. The at least one diffusion layer 50, 60 has a thickness in the range of 0.1 to 3.0 microns, and, preferably, approximate 1.5 microns. A layer 70 of a fluoropolymer dielectric material, or other suitable dielectric material, may be laminated on the top surface of the copper layer 20 and/or on the bottom surface of the copper layer 40. The CIC portion of the laminate 10 also exhibits optimum properties in that it has: a tensile strength ranging from 75 to 85 kpsi; a mass resistivity in a range of 0.75 to 1.0 ohm.gram/m$^2$; a thickness of approximately 2 mils; a hardness in a range of 170 to 230 Knoop; and an elongation in a range of 4 to 6%.

A completed HPCC including the laminate 10 has a thickness of approximately 6 mils and a CTE in the range of 8–12 PPM/°C. (a completed HPCC has several additional layers not shown in FIG. 2).

The properties of the CIC laminate provide the tensile and yield strength to resist the physical forces present during the lamination cycle, the proper modulus and CTE to achieve the right composite CTE for the packaging application and low enough resistivity to handle the current distribution power required by the electrical design.

The CIC produced in accordance with the present invention may be used in the fabrication of laminate chip carriers (LCC's), in conjunction with fluoropolymers and other non-fluoropolymer dielectrics. The non-fluoropolymer dielectrics may include, for example, epoxy/glass resin, bismaleimide triazine (BT resin), cyanate esters, polypheneylene oxide/epoxy blends, and allylated polyphenylene ether resins.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A process of preparing a copper-INVAR-copper clad sheet comprising the steps of:
   providing a section of copper-Invar-copper clad sheet; and
   annealing the section at a temperature in a range of 1475° F. to 1625° F. for a time in a range of 40 to 120 seconds.

2. The process of claim 1, further comprising the step of rolling the section prior to annealing.

3. The process of claim 1, further comprising the step of rolling the section after annealing.

4. The process of claim 3, further comprising the step of heat treating the section after rolling.

5. The process of claim 1, further comprising the step of providing a layer of fluoropolymer dielectric on the section.

6. The process of claim 1, further comprising the step of heat treating the section at a temperature in a range of 1275° F. to 1425° F. for a time in a range of 40 to 120 seconds.

7. The process of claim 6, wherein the heat treating temperature is maintained at approximately 1350° F. and the time duration is approximately 60 seconds.

8. The process of claim 1, wherein the annealing temperature is maintained at approximately 1550° F. and the time duration is approximately 60 seconds.

9. The process of claim 1, further comprising the step of heat treating the section in a bell anneal furnace at a temperature in a range of 1000° F. to 1200° F. for a time in a range of 7 to 9 minutes.

10. The process of claim 9, wherein the heat treating temperature is maintained at approximately 1100° F. and the time duration is approximately 8 minutes.

11. A process of preparing a copper-INVAR-copper clad sheet comprising the steps of:
    providing a section of copper-INVAR-copper clad sheet; and
    heat treating the section at a temperature in a range of 1275° F. to 1425° F. for a time in a range of 40 to 120 seconds.

12. The process of claim 11, further comprising the step of rolling the section prior to heat treating.

13. The process of claim 11, further comprising the step of annealing the section prior to heat treating.

14. The process of claim 13, further comprising the step of rolling the section prior to annealing.

15. The process of claim 11, further comprising the step of providing a layer of fluoropolymer dielectric on the section.

16. The process of claim 11, further comprising the step of annealing the section at a temperature in a range of 1475° F. to 1625° F. for a time in a range of 40 to 120 seconds.

17. The process of claim 16, wherein the annealing temperature is maintained at approximately 1550° F. and the time duration is approximately 60 seconds.

18. The process of claim 11, wherein the heat treating temperature is maintained at approximately 1350° F. and the time duration is approximately 60 seconds.

19. The process of claim 11, wherein the heat treating is alternately performed in a bell anneal furnace at a temperature in a range of 1000° F. to 1200° F. for a time in a range of 7 to 9 minutes.

20. The process of claim 19, wherein the heat treating temperature in the bell anneal furnace is maintained at approximately 1100° F. and the time duration is approximately 8 minutes.

21. The process of claim 11, further comprising the step of:
    providing a layer of dielectric on the section, wherein the dielectric is selected from the group consisting of: epoxy/glass resin, bismaleimide triazine (BT resin), cyanate esters, polypheneylene oxide/epoxy blends, and allylated polyphenylene ether resins.

22. A clad sheet comprising:
    a layer of INVAR between two layers of copper and having a mass resistivity in a range of 0.75 to 1.0 ohm.gram/m$^2$.

23. The clad sheet of claim 22, wherein the clad sheet has a tensile strength in a range of 75 to 85 kpsi.

24. The clad sheet of claim 22, wherein the clad sheet has at least one diffusion layer between the layer of INVAR and a layer copper in the range of 0.1 to 3.0 microns thick.

25. The clad sheet of claim 24, wherein the at least one diffusion layer has a thickness of approximately 1.5 microns.

26. The clad sheet of claim 22, wherein the layer of INVAR makes up approximately 75% of the thickness of the clad sheet and the layers of copper each make up approximately 12.5% of the thickness of the clad sheet.

27. The clad sheet of claim 22, wherein the clad sheet has a thickness of approximately 2 mils.

28. The clad sheet of claim 22, wherein the clad sheet has a hardness in a range of 170 to 230 Knoop.

29. The clad sheet of claim 22, wherein the clad sheet has an elongation in a range of 4 to 6%.

30. A clad sheet comprising:
    a layer of INVAR between two layers of copper and having a post-anneal mass resistivity in a range of 0.60 to 0.85 ohm.gram/m$^2$.

31. The clad sheet of claim 30, wherein the clad sheet has a post-anneal tensile strength in a range of 55 to 75 kpsi.

32. The clad sheet of claim 30, wherein the clad sheet has at least one diffusion layer between the layer of INVAR and a layer copper in the range of 0.1 to 3.0 microns thick.

33. The clad sheet of claim 30, wherein the layer of INVAR makes up approximately 75% of the thickness of the clad sheet and the layers of copper each make up approximately 12.5% of the thickness of the clad sheet.

34. The clad sheet of claim 30, wherein the clad sheet has a thickness of approximately 4 mils.

35. The clad sheet of claim 30, wherein the clad sheet has a hardness in a range of 170 to 230 Knoop.

36. The clad sheet of claim 30, wherein the clad sheet has a post-anneal elongation in a range of 12 to 14%.

37. The clad sheet of claim 30, wherein the post-anneal mass resistivity is approximately 0.7 ohm.gram/m$^2$.

* * * * *